United States Patent
Hong et al.

(10) Patent No.: US 11,043,536 B2
(45) Date of Patent: Jun. 22, 2021

(54) TWO-TERMINAL SWITCHING ELEMENT HAVING BIDIRECTIONAL SWITCHING CHARACTERISTIC, RESISTIVE MEMORY CROSS-POINT ARRAY INCLUDING SAME, AND METHOD FOR MANUFACTURING TWO-TERMINAL SWITCHING ELEMENT AND CROSS-POINT RESISTIVE MEMORY ARRAY

(71) Applicant: INDUSTRY-UNIVERSITY COOPERATION FOUNDATION HANYANG UNIVERSITY, Seoul (KR)

(72) Inventors: Jinpyo Hong, Seoul (KR); Yooncheol Bae, Seoul (KR); Ahrham Lee, Gimhae-si (KR); Gwangho Baek, Incheon (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 16/229,742

(22) Filed: Dec. 21, 2018

(65) Prior Publication Data
US 2019/0148455 A1    May 16, 2019

Related U.S. Application Data

(62) Division of application No. 14/778,381, filed as application No. PCT/KR2014/002423 on Mar. 21, 2014, now abandoned.

(30) Foreign Application Priority Data

Mar. 21, 2013 (KR) .................. 10-2013-0030110
Mar. 21, 2013 (KR) .................. 10-2013-0030113

(51) Int. Cl.
H01L 47/00    (2006.01)
H01L 27/24    (2006.01)
(Continued)

(52) U.S. Cl.
CPC ........ *H01L 27/2463* (2013.01); *H01L 27/222* (2013.01); *H01L 27/224* (2013.01);
(Continued)

(58) Field of Classification Search
CPC ... H01L 27/222; H01L 27/224; H01L 27/226; H01L 27/2409; H01L 27/2436;
(Continued)

(56) References Cited

U.S. PATENT DOCUMENTS 6,965,137 B2 * 11/2005 Kinney ............... G11C 11/5685
257/295
7,145,790 B2 * 12/2006 Kang ................. G11C 13/0004
365/148
(Continued)

FOREIGN PATENT DOCUMENTS

CN    102844865 A    12/2012
JP    2011-014796 A    1/2011
(Continued)

*Primary Examiner* — Jay C Kim (57) ABSTRACT

Provided are a two-terminal switching element having a bidirectional switching characteristic, a resistive memory cross-point array including the same, and methods for manufacturing the two-terminal switching element and the cross-point resistive memory array. The two-terminal switching element includes a first electrode and a second electrode. A pair of first conductive metal oxide semiconductor layers electrically connected to the first electrode and the second electrode, respectively, is provided. A second conductive metal oxide semiconductor layer is disposed between the first conductive metal oxide semiconductor layers. There-
(Continued)

fore, the two-terminal switching element can show a symmetrical and bidirectional switching characteristic.

5 Claims, 6 Drawing Sheets

(51) Int. Cl.
    *H01L 45/00*     (2006.01)
    *H01L 27/22*     (2006.01)
    *H01L 43/02*     (2006.01)
    *H01L 43/08*     (2006.01)
    *H01L 43/10*     (2006.01)
    *H01L 43/12*     (2006.01)
    *H01L 29/861*     (2006.01)

(52) U.S. Cl.
    CPC .......... *H01L 27/2409* (2013.01); *H01L 43/02* (2013.01); *H01L 43/08* (2013.01); *H01L 43/10* (2013.01); *H01L 43/12* (2013.01); *H01L 45/08* (2013.01); *H01L 45/1233* (2013.01); *H01L 45/1253* (2013.01); *H01L 45/143* (2013.01); *H01L 45/146* (2013.01); *H01L 45/147* (2013.01); *H01L 45/16* (2013.01); *H01L 29/861* (2013.01)

(58) Field of Classification Search
    CPC ... H01L 27/2463; H01L 29/861; H01L 43/02; H01L 43/08; H01L 43/10; H01L 43/12; H01L 45/08; H01L 45/1233; H01L 45/1253; H01L 45/143; H01L 45/146; H01L 45/147; H01L 45/16
    See application file for complete search history.

(56) References Cited

U.S. PATENT DOCUMENTS

| | | | | |
|---|---|---|---|---|
| 7,176,064 B2* | 2/2007 | Herner | ............... | G11C 13/0069 257/530 |
| 7,446,010 B2* | 11/2008 | Li | ............... | G11C 13/0007 257/E21.304 |
| 7,573,083 B2* | 8/2009 | Kijima | ............... | H01L 27/11502 257/192 |
| 7,633,790 B2* | 12/2009 | Rinerson | ............... | H01L 45/146 365/148 |
| 7,678,607 B2* | 3/2010 | Chiang | ............... | H01L 45/04 438/104 |
| 7,871,866 B2* | 1/2011 | Jeong | ............... | G11C 13/003 257/E47.001 |
| 7,875,871 B2* | 1/2011 | Kumar | ............... | H01L 21/84 257/2 |
| 8,017,860 B2* | 9/2011 | Lee | ............... | B82Y 10/00 136/252 |
| 8,054,674 B2* | 11/2011 | Tamai | ............... | G11C 13/0011 365/148 |
| 8,062,918 B2* | 11/2011 | Miller | ............... | H01L 21/265 438/45 |
| 8,072,795 B1* | 12/2011 | Wang | ............... | G11C 13/0007 365/148 |
| 8,097,878 B2* | 1/2012 | Kumar | ............... | G11C 13/0007 257/2 |
| 8,101,937 B2* | 1/2012 | Chiang | ............... | G11C 13/0007 257/2 |
| 8,148,765 B2* | 4/2012 | Shim | ............... | G11C 13/0007 257/310 |
| 8,264,865 B2* | 9/2012 | Mitani | ............... | G11C 13/0007 365/100 |
| 8,279,657 B2* | 10/2012 | Takagi | ............... | H01L 27/101 365/148 |
| 8,385,102 B2* | 2/2013 | Xiao | ............... | G11C 13/0007 365/148 |
| 8,391,045 B2* | 3/2013 | Kubo | ............... | B82Y 10/00 365/148 |
| 8,395,927 B2* | 3/2013 | Kreupl | ............... | G11C 11/16 365/148 |
| 8,406,032 B2* | 3/2013 | Ahn | ............... | G11C 11/22 365/145 |
| 8,471,246 B2* | 6/2013 | Suzuki | ............... | B82Y 10/00 136/263 |
| 8,471,360 B2* | 6/2013 | Kreupl | ............... | H01L 45/124 257/532 |
| 8,520,425 B2* | 8/2013 | Xiao | ............... | G11C 13/0007 365/148 |
| 8,536,558 B1* | 9/2013 | Tan | ............... | H01L 45/04 257/3 |
| 8,537,592 B2* | 9/2013 | Liu | ............... | H01L 21/302 365/148 |
| 8,551,809 B2* | 10/2013 | Kumar | ............... | H01L 45/08 257/4 |
| 8,675,393 B2* | 3/2014 | Katayama | ............... | H01L 45/08 365/148 |
| 8,716,690 B2* | 5/2014 | Kim | ............... | H01L 45/1233 257/2 |
| 8,748,934 B2* | 6/2014 | Pan | ............... | H01L 29/7827 257/107 |
| 8,753,949 B2* | 6/2014 | Ramaswamy | ............... | H01L 45/04 257/4 |
| 8,791,447 B2* | 7/2014 | Liu | ............... | G11C 5/02 257/5 |
| 8,841,648 B2* | 9/2014 | Chen | ............... | G11C 11/5685 257/2 |
| 8,848,425 B2* | 9/2014 | Schloss | ............... | G11C 13/0002 365/148 |
| 8,848,430 B2* | 9/2014 | Costa | ............... | G11C 5/02 365/158 |
| 8,995,171 B2* | 3/2015 | Hayakawa | ............... | H01L 27/2409 365/148 |
| 9,147,840 B2* | 9/2015 | Knobloch | ............... | H01L 27/2463 |
| 9,184,381 B2* | 11/2015 | Mikawa | ............... | H01L 27/101 |
| 9,236,567 B2* | 1/2016 | Lee | ............... | H01L 45/1253 |
| 9,252,189 B2* | 2/2016 | Fujii | ............... | H01L 27/228 |
| 9,472,301 B2* | 10/2016 | Bandyopadhyay | ............... | G11C 11/5692 |
| 9,548,449 B2* | 1/2017 | Karpov | ............... | H01L 27/2463 |
| 10,475,815 B2* | 11/2019 | Lupino | ............... | G11C 13/0007 |
| 2006/0245235 A1* | 11/2006 | Krieger | ............... | H01L 27/1021 365/115 |
| 2007/0015329 A1* | 1/2007 | Li | ............... | H01L 29/66143 438/250 |
| 2008/0247219 A1* | 10/2008 | Choi | ............... | H01L 27/2409 365/148 |
| 2008/0304308 A1* | 12/2008 | Stipe | ............... | G11C 13/0007 365/51 |
| 2010/0061142 A1* | 3/2010 | Arita | ............... | G11C 13/0007 365/148 |
| 2011/0073991 A1 | 3/2011 | Kuriki et al. | | |
| 2011/0233507 A1 | 9/2011 | Sonehara et al. | | |
| 2011/0233508 A1* | 9/2011 | Araki | ............... | H01L 45/08 257/4 |
| 2013/0168628 A1* | 7/2013 | Hwang | ............... | H01L 45/06 257/1 |
| 2013/0214235 A1 | 8/2013 | Hong et al. | | |
| 2014/0061572 A1* | 3/2014 | Cho | ............... | H01L 21/8239 257/4 |

FOREIGN PATENT DOCUMENTS

| | | |
|---|---|---|
| JP | 2011-204814 A | 10/2011 |
| WO | 2011/008622 A1 | 1/2011 |
| WO | 2012/057499 A2 | 5/2015 |

\* cited by examiner

TWO-TERMINAL SWITCHING ELEMENT HAVING BIDIRECTIONAL SWITCHING CHARACTERISTIC, RESISTIVE MEMORY CROSS-POINT ARRAY INCLUDING SAME, AND METHOD FOR MANUFACTURING TWO-TERMINAL SWITCHING ELEMENT AND CROSS-POINT RESISTIVE MEMORY ARRAY

TECHNICAL FIELD

The present invention relates to a switching element, and more particularly, to a two-terminal switching element having a bidirectional switching characteristic.

BACKGROUND ART

Currently, in flash memories commercialized as resistive random access memories (RRAMs), a change of a threshold voltage according to storage of charges in a charge storage layer or removal of charges from the charge storage layer is used. A charge storage layer may be a floating gate which is a polysilicon layer or a charge trap layer which is a silicon nitride layer. Recently, new generation resistive memory elements having lower power consumption and a higher degree of integration than flash memories have been studied. For example, the new generation resistive memory elements include a phase-change random access memory (PRAM), a magnetoresistive RAM (MRAM), and a resistance change RAM (ReRAM).

In order to implement resistive memory elements as an array, in general, a resistive element having a memory characteristic and a selective element electrically connected to the resistive element are provided. The selective element may be a transistor or a diode. However, transistors have a limitation that the size of the element is reduced due to a short channel effect such as punch through. Further, since a general diode makes current flow in one direction, there is a disadvantage that the diode is not appropriate for a bipolar element having a resistance change characteristic in a positive polarity such as the resistive element. Further, in a transistor, since a gate electrode, source/drain regions, and source/drain electrodes are formed, there is a disadvantage that the transistor is not appropriate for a high degree of integration.

To solve these problems, Republic of Korea Patent Application Publication No. 2011-0074354 discloses a memory element in which a pair of PN diodes are formed at both ends of a bipolar memory element. However, in this case, it may be difficult for a characteristic of a PN diode formed at a lower end of the bipolar memory element and a characteristic of a PN diode formed at an upper end of the bipolar memory element to be symmetric. Further, when a forward electric field is applied to any one of the two PN diodes, a backward electric field is applied to the other. Since a forward current density is reduced by a backward current density, the normal memory operation may be difficult.

DISCLOSURE

Technical Problem

The present invention is directed to providing a two-terminal switching element having a bidirectional switching characteristic and a symmetrical element operating characteristic, a resistive memory cross-point array in which one two-terminal switching element is included in a unit cell to improve a degree of integration, and methods of manufacturing the same.

Technical Solution

One aspect of the present invention provides a two-terminal switching element. A first electrode and a second electrode are provided. A pair of first conductivity type metal oxide semiconductor layers electrically connected to each of the first electrode and the second electrode are disposed. A second conductivity type metal oxide semiconductor layer disposed is disposed between the first conductivity type metal oxide semiconductor layers.

The first conductivity type metal oxide semiconductor layers may be the same material layers.

Any one of the first conductivity type and the second conductivity type may be a P-type and the other may be an N-type. The P-type metal oxide semiconductor layers may each have a band gap of 3 eV or less. The P-type metal oxide semiconductor layer may have an atomic ratio of oxygen in a range 30% to 50% greater than a case in which a stoichiometric ratio is satisfied. The P-type metal oxide semiconductor layer may be $CuO_x$ ($1.1 < x \leq 1.5$) or $CoO_x$ ($1.1 < x \leq 1.5$). The N-type metal oxide semiconductor layer may be one metal oxide layer selected from the group consisting of $ZnO$, $SnO_2$, $In_2O_3$, $Ga_2O_3$, $InSnO$, $GaInO$, $ZnInO$, $ZnSnO$, $InGaZnO$, $TiO_2$, $CeO_2$, $Al_2O_3$, $Ta_2O_5$, $LaO_2$, $NbO_2$, $LiNbO_3$, $BaSrTiO_3$, $SrTiO_3$, $ZrO_2$, $SrZrO_3$, Nb-doped $SrTiO_3$, Cr-doped $SrTiO_3$, and Cr-doped $SrZrO_3$.

Another aspect of the present invention provides a resistive memory cross-point array. The resistive memory cross-point array includes a first end electrode and a second end electrode. A switching layer is disposed between the first end electrode and the second end electrode. The switching layer includes a pair of first conductivity type metal oxide semiconductor layers and a second conductivity type metal oxide semiconductor layer disposed between the first conductivity type metal oxide semiconductor layers. A bipolar variable resistive layer is disposed between the switching layer and the second end electrode.

The variable resistive layer may be a magnetic tunnel junction (MTJ) structure or a resistance change memory layer.

An intermediate electrode may be located between the switching layer and the variable resistive layer. The first end electrode and the intermediate electrode may be the same material layers.

Still another aspect of the present invention provides a method of manufacturing a two-terminal switching element. First, a first conductivity type lower metal oxide semiconductor layer is formed on a first electrode. A second conductivity type metal oxide semiconductor layer is formed on the first conductivity type lower metal oxide semiconductor layer. A first conductivity type upper metal oxide semiconductor layer is formed on the second conductivity type metal oxide semiconductor layer. A second electrode is formed on the first conductivity type upper metal oxide semiconductor layer.

Annealing may be performed on a resulting structure on which the second electrode is formed. The annealing may include heat treatment or ultraviolet (UV) treatment.

The first conductivity type metal oxide semiconductor layers may be the same material layers.

Any one of the first conductivity type and the second conductivity type may be a P-type and the other may be an N-type. The P-type metal oxide semiconductor layer may have a band gap of 3 eV or less. The P-type metal oxide semiconductor layer may have an atomic ratio of oxygen in a range 30% to 50% greater than a case in which a stoichiometric ratio is satisfied. The P-type metal oxide semiconductor layer may be $CuO_x$ (1.1<x≤1.5) or $CoO_x$ (1.1<x≤1.5). The N-type metal oxide semiconductor layer may be one metal oxide layer selected from the group consisting of ZnO, $SnO_2$, $In_2O_3$, $Ga_2O_3$, InSnO, GaInO, ZnInO, ZnSnO, InGaZnO, $TiO_2$, $CeO_2$, $Al_2O_3$, $Ta_2O_5$, $LaO_2$, $NbO_2$, $LiNbO_3$, $BaSrTiO_3$, $SrTiO_3$, $ZrO_2$, $SrZrO_3$, Nb-doped $SrTiO_3$, Cr-doped $SrTiO_3$, and Cr-doped $SrZrO_3$.

Yet another aspect of the present invention provides a method of manufacturing a resistive memory cross-point array. First, a switching layer including a first conductivity type lower metal oxide semiconductor layer, a second conductivity type metal oxide semiconductor layer, and a first conductivity type upper metal oxide semiconductor layer is formed on a first end electrode. A second end electrode is formed on the switching layer. A variable resistive layer is formed on the first end electrode before the switching layer is formed or on the switching layer before the second end electrode is formed.

Annealing may be performed on a resulting structure on which the switching layer is formed. The annealing may include heat treatment or UV treatment.

The variable resistive layer may be a bipolar variable resistive layer, for example, an MTJ structure or a resistance change memory layer.

An intermediate electrode may be formed between the switching layer and the variable resistive layer. The first or second end electrode and the intermediate electrode, which are adjacent to the switching layer, may be the same material layers.

Advantageous Effects

According to the present invention, a two-terminal switching element includes a pair of first conductivity type metal oxide semiconductor layers and a second conductivity type metal oxide semiconductor layer disposed between the first conductivity type metal oxide semiconductor layers, and thus can show a symmetrical and bidirectional switching characteristic. Further, a degree of integration of a resistive memory cross-point array can be improved using the two-terminal switching element.

MODES OF THE INVENTION

Hereinafter, in order to further specifically describe the invention, exemplary embodiments of the present invention will be described in more detail with reference to the accompanying drawings. However, the invention is not limited to the above-described embodiments, and may be embodied in different forms.

In this specification, it will be understood that when a layer is referred to as being disposed "on" another layer or a substrate, it can be directly formed on the other layer or the substrate, or a third layer can be interposed therebetween. Further, in this specification, it will be understood that orientational terms such as "upper side," "upper (portion)," or "upper surface" used herein may also be understood to refer to a "lower side," "lower (portion)," "lower surface," "side," "side (portion)," or "side surface." That is, spatially orientational terms should be understood to refer to relative orientations but should not be understood to refer to absolute orientations for purposes of limitation. In addition, in this specification, terms such as "first" or "second" do not limit components, and will be understood only as terms distinguishing components.

Further, thicknesses of layers and areas are exaggerated for clarity in the drawings of this specification. The same reference numerals indicate the same components throughout the specification.

Figure 1:
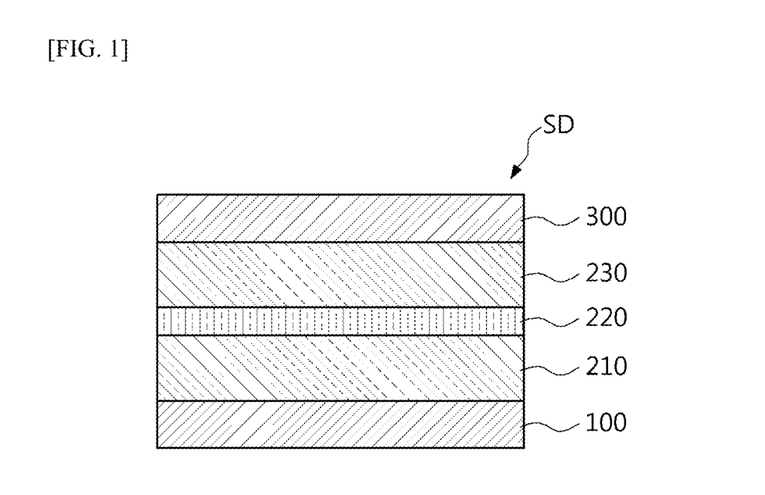
FIG. 1 is a cross-sectional view illustrating a two-terminal switching element according to an embodiment of the present invention.

FIG. 1 is a cross-sectional view illustrating a two-terminal switching element according to an embodiment of the present invention.

Referring to FIG. 1, the two-terminal switching element includes a first electrode 100, a second electrode 300, a pair of first conductivity type metal oxide semiconductor layers 210 and 230 electrically connected to the first electrode 100 and the second electrode 300, respectively, and a second conductivity type metal oxide semiconductor layer 220 disposed between the first conductivity type metal oxide semiconductor layers 210 and 230. As the first conductivity type and the second conductivity type are opposite conductivity types, one may be a P-type and the other may be an N-type. Therefore, the two-terminal switching element may have a structure of P-N-P or N-P-N.

When a voltage having a predetermined absolute value or more is applied between the first electrode 100 and the second electrode 300, a depletion layer may be formed throughout the second conductivity type metal oxide semiconductor layer 220. In this case, a current may be conducted in a portion to which a reverse bias is applied among side surfaces of the second conductivity type metal oxide semiconductor layer 220, which are in contact with the first conductivity type metal oxide semiconductor layers 210 and 230. As a result, the two-terminal switching element may be turned on and may have both a threshold voltage having a positive value and a threshold voltage having a negative value, and thus bidirectional switching may be implemented.

Meanwhile, the second conductivity type metal oxide semiconductor layer 220 may have a smaller thickness than each of the first conductivity type metal oxide semiconductor layers 210 and 230. In this case, an absolute value of the threshold voltage may be reduced. Each of the first conductivity type metal oxide semiconductor layers 210 and 230 may have a thickness in a range of 10 nm to 100 nm, and preferably, a thickness of 30 nm or less. Further the second conductivity type metal oxide semiconductor layer 220 may have a thickness in a range of 1 nm to 20 nm, and preferably a thickness of 5 nm or less.

The first conductivity type metal oxide semiconductor layers 210 and 230 may be a lower metal oxide semiconductor layer 210 having a first conductivity type and an upper metal oxide semiconductor layer 230 having a first conductivity type. The lower and upper metal oxide semiconductor layers 210 and 230 may be the same material layer, and may have substantially the same thickness. In this case, the symmetry of the two-terminal switching element may be improved. However, the lower and upper metal oxide semiconductor layer 210 and 230 are not limited thereto, and may be different materials when the lower metal oxide semiconductor layer 210 having a first conductivity type and the upper metal oxide semiconductor layer 230 having a first conductivity type have the same conductivity type. Alternatively, the lower metal oxide semiconductor layer 210 having a first conductivity type and the upper metal oxide semiconductor layer 230 having a first conductivity type may have different thicknesses.

When the first conductivity type metal oxide semiconductor layers 210 and 230 are P-type metal oxide semiconductor layers, the second conductivity type metal oxide semiconductor layer 220 may be an N-type metal oxide semiconductor layer. On the other hand, when the first conductivity type metal oxide semiconductor layers 210 and 230 are the N-type metal oxide semiconductor layers, the second conductivity type metal oxide semiconductor layer 220 may be the P-type metal oxide semiconductor layer. In this case, as an example, the P-type metal oxide semiconductor layers may each be one metal oxide layer selected from the group consisting of $NiO_x$ ($1.1<x\leq1.5$), $FeO_x$ ($1.1<x\leq1.5$), $CoO_x$ ($1.1<x\leq1.5$), $PdO_x$ ($1.1<x\leq1.5$), $CuAlO_x$ ($1.8\leq x<3$), $CuGaO_x$ ($1.8\leq x<3$), $SrCu_2O_x$ ($1\leq x<1.8$), $RhO_x$ ($1.1<x\leq1.5$), $CrO_x$ ($1.1<x\leq1.5$), $CuO_x$ ($1.1<x\leq1.5$), $Cu_xO$ ($1.5<x\leq2$), $SnO_x$ ($1.1<x\leq1.5$), $Ag_2O$ ($1.5<x\leq2$), $LaMnO_x$ ($2.5<x\leq3$), $YBaCu_2O_x$ ($3.5<x\leq4$), PCMO ($PrCaMnO_3$), LCMO ($LaCaMnO_3$), LSMO ($LaSrMnO_3$), and PZTO ($PbZrTiO_3$). Meanwhile, the N-type metal oxide semiconductor layers may each be one metal oxide layer selected from the group consisting of ZnO, $SnO_2$, $In_2O_3$, $Ga_2O_3$, InSnO, GaInO, ZnInO, ZnSnO, InGaZnO, $TiO_2$, $CeO_2$, $Al_2O_3$, $Ta_2O_5$, $LaO_2$, $NbO_2$, $LiNbO_3$, $BaSrTiO_3$, $SrTiO_3$, $ZrO_2$, $SrZrO_3$, Nb-doped $SrTiO_3$, Cr-doped $SrTiO_3$, and Cr-doped $SrZrO_3$.

In general, it has been very difficult to actually apply the P-type metal oxide semiconductor to an element due to an extremely low current density. To solve such difficulty, the P-type metal oxide semiconductor layer may have a band gap of 3 eV or less, for example, 2 eV or less. In this case, the current density of the P-type metal oxide semiconductor layer may be significantly improved. Alternatively, the P-type metal oxide semiconductor layer may have a band gap of 1 eV or more. As an example, the P-type metal oxide semiconductor layer which satisfies this condition may be $CuO_x$ ($1.1<x\leq1.5$, a band gap is in a range of 1.2 eV to 1.4 eV) or $CoO_x$ ($1.1<x\leq1.5$, a band gap is in a range of 1.4 eV to 1.6 eV). Further, the P-type metal oxide semiconductor layer may have an atomic ratio of oxygen in a range 10% to 50%, specifically, 30% to 50%, greater than a case in which an atomic ratio of oxygen with respect to a metal satisfies a stoichiometric ratio. Further, the P-type metal oxide semiconductor layer which satisfies this condition may be $CuO_x$ ($1.1<x\leq1.5$) or $CoO_x$ ($1.1<x\leq1.5$).

The first electrode 100 and the second electrode 300 may be formed of materials which may achieve an ohmic contact with the first conductivity type metal oxide semiconductor layers 210 and 230 connected thereto, respectively. As an example, the first electrode 100 and the second electrode 300 each may be Al, W, Pt, Ti, TiN, TaN, WN, or Cu.

Further, a method of manufacturing a two-terminal switching element according to an embodiment of the present invention will be described with reference to FIG. 1.

The method of manufacturing the two-terminal switching element according to an embodiment of the present invention may include forming a first conductivity type lower metal oxide semiconductor layer 210 on a first electrode 100, forming a second conductivity type metal oxide semiconductor layer 220 on the first conductivity type lower metal oxide semiconductor layer 210, forming a first conductivity type upper metal oxide semiconductor layer 230 on the second conductivity type metal oxide semiconductor layer 220, and forming a second electrode 300 on the first conductivity type upper metal oxide semiconductor layer 230.

Referring to FIG. 1, the first electrode 100, the lower metal oxide semiconductor layer 210 having the first conductivity type, the second conductivity type metal oxide semiconductor layer 220, the upper metal oxide semiconductor layer 230 having the first conductivity type, and the second electrode 300 are sequentially formed to form the two-terminal switching element.

As the first conductivity type and the second conductivity type are opposite conductivity types, one may be a P-type and the other may be an N-type. Therefore, the two-terminal switching element may have a structure of P-N-P or N-P-N.

The first electrode 100, the lower metal oxide semiconductor layer 210 having the first conductivity type, the second conductivity type metal oxide semiconductor layer 220, the upper metal oxide semiconductor layer 230 having the first conductivity type, and the second electrode 300 may be formed using a sputtering method with an appropriate target. Specifically, when the P-type metal oxide semiconductor layer among the metal oxide semiconductor layers 210, 220, and 230 is formed, the sputtering method may be performed in an atmosphere in which inert gas and oxygen are mixed. As a result, a metal vacancy is formed in the P-type metal oxide semiconductor layer, and thus a current density of the P-type metal oxide semiconductor layer may be improved. However, the metal vacancy is not limited thereto, and may also be formed using a pulsed laser deposition (PLD) method, a thermal evaporation method, an electron-beam evaporation method, a physical vapor deposition (PVD) method, a molecular beam epitaxy (MBE) deposition method, or a chemical vapor deposition (CVD) method.

After the second electrode 300 is formed, annealing such as heat treatment, ultraviolet (UV) treatment, or combination treatment in which a plurality thereof are applied may be performed. In this case, an on-current density and an on/off ratio of the two-terminal selective element may be improved, and a threshold voltage (a turn-on voltage) may be lowered. The heat treatment may be heat treatment using rapid thermal annealing (RTA) or a furnace. The UV treatment may be annealing using a UV lamp and may be performed using UV-C (UV having a wavelength in a range of 100 nm to 280 nm).

Figure 2:
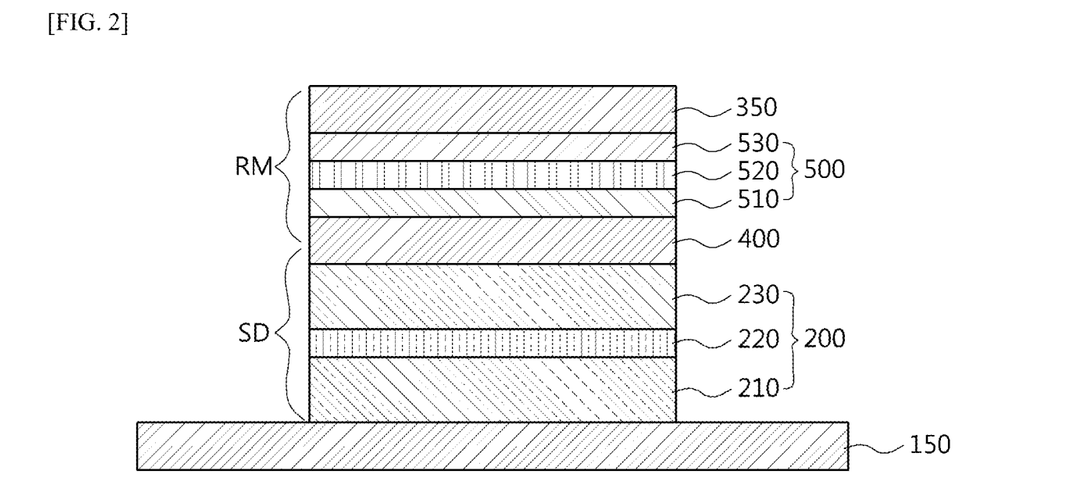
FIG. 2 is a cross-sectional view illustrating a unit cell of a resistive memory cross-point array according to an embodiment of the present invention.

FIG. 2 is a cross-sectional view illustrating a resistive memory cross-point array according to an embodiment of the present invention, and is limited to a unit cell.

Referring to FIG. 2, the resistive memory cross-point array includes a first end electrode 150 and a second end electrode 350 crossing an upper portion of the first end electrode 150. A switching layer 200 and a variable resistive layer 500, which are sequentially stacked, are disposed at a point at which the end electrodes 150 and 350 cross. However, these are not limited thereto, and the switching layer 200 may be stacked on the variable resistive layer 500. An intermediate electrode 400 may be disposed between the switching layer 200 and the variable resistive layer 500. The first end electrode 150, the switching layer 200, and the intermediate electrode 400 may constitute a two-terminal switching element SD, and the intermediate electrode 400, the variable resistive layer 500, and the second end electrode 350 may constitute a variable resistive element RM. Furthermore, the first end electrode 150 may serve as a word line or an additional word line may be connected to the first end electrode 150. Further, the second end electrode 350 may serve as a bit line or an additional bit line may be connected to the second end electrode 350.

At least after the switching layer 200 is formed, for example, before the intermediate electrode 400 is formed after the switching layer 200 is formed, or before the variable resistive layer 500 is formed after the switching layer 200 and the intermediate electrode 400 are formed thereon, annealing may be performed. The annealing may be heat treatment, UV treatment, or combination treatment in which a plurality thereof are applied. In this case, an on-current density and an on/off ratio of the two-terminal selective element SD may be improved, and a threshold voltage may be lowered. The heat treatment may be heat treatment using RTA or a furnace. The UV treatment may be annealing using a UV lamp and may be performed using UV-C (UV having a wavelength in a range of 100 nm to 280 nm).

Each of the end electrodes 150 and 350 and the intermediate electrode 400 may be an Al, W, Pt, Ti, TiN, TaN, WN, or Cu layer. However, the end electrodes provided at both sides of the switching layer 200 and the immediate electrode may be formed with the same material layer. In this case, the symmetry of the switching element SD may be improved. However, this is not limited thereto.

The switching layer 200 includes a pair of the first conductivity type metal oxide semiconductor layers 210 and 230 and a second conductivity type metal oxide semiconductor layer 220 disposed between the first conductivity type metal oxide semiconductor layers 210 and 230. One of the first conductivity type metal oxide semiconductor layers 210 and 230 may be electrically connected to one of the end electrodes 150 and 350. The first conductivity type metal oxide semiconductor layers 210 and 230 may be a lower metal oxide semiconductor layer 210 having a first conductivity type and an upper metal oxide semiconductor layer 230 having a first conductivity type. As an example, the lower metal oxide semiconductor layer 210 is connected to the first end electrode 150. When the intermediate electrode 400 is disposed, the upper metal oxide semiconductor layer 230 may be connected to the intermediate electrode 400. The first conductivity type metal oxide semiconductor layers 210 and 230 and the second conductivity type metal oxide semiconductor layer 220 will be described in detail with reference to the embodiment described with reference to FIG. 1.

The variable resistive layer 500 may be electrically connected to the upper metal oxide semiconductor layer 230. When the intermediate electrode 400 is disposed, the variable resistive layer 500 is connected to the intermediate electrode 400. The variable resistive layer 500 may be a bipolar variable resistive layer. The variable resistive element RM including the variable resistive layer 500 may include a magnetoresistive random access memory (MRAM), specifically a spin transfer torque MRAM. In this case, the variable resistive layer 500 has a magnetic tunnel junction (MTJ) structure, and the MTJ structure may have a ferromagnetic pinned layer 510, a tunnel barrier layer 520, and a ferromagnetic free layer 530, which are sequentially stacked. The MTJ structure may further include a pinning layer (nor shown) under the ferromagnetic pinned layer 510. The ferromagnetic pinned layer 510, which is a layer in which magnetization reversal does not occur, may be a CoFeB layer or a FePt layer. The tunnel barrier layer 520 may be an aluminum oxide layer or a magnesium oxide layer. The ferromagnetic free layer 530, which is a layer in which magnetization reversal occurs at a critical current density or more, may be a CoFeB layer or a FePt layer. The ferromagnetic free layer 530 may have a magnetization direction opposite that of the pinned layer at a positive critical current density or more, and at a negative critical current density or less. Therefore, the spin transfer torque MRAM may operate as a bipolar element.

Further, a method of manufacturing a resistive memory cross-point array according to an embodiment of the present invention will be described with reference to FIG. 2.

The method of manufacturing the resistive memory cross-point array according to an embodiment of the present invention may include forming a switching layer 200 including a first conductivity type lower metal oxide semiconductor layer 210, a second conductivity type metal oxide semiconductor layer 220, and a first conductivity type upper metal oxide semiconductor layer 230 on a first end electrode 150, forming a second end electrode 350 on the switching layer 200, and forming a variable resistive layer 500 on the first end electrode 150 before the switching layer 200 is formed or on the switching layer 200 before the second end electrode 350 is formed.

Referring to FIG. 2, the first end electrode 150 is formed. The first end electrode 150 may be formed to extend in one direction. The switching layer 200 may be formed on the first end electrode 150. The variable resistive layer 500 may be formed on the switching layer 200. The second end electrode 350 crossing the first end electrode 150 may be formed on the variable resistive layer 500. However, this is not limited thereto, and the variable resistive layer 500 may be formed on the first end electrode 150 before the switching layer 200 is formed. Thus, a structure in which the switching layer 200 and the variable resistive layer 500 are stacked may be disposed at a point at which the end electrodes 150 and 350 cross.

An intermediate electrode 400 may be formed between the switching layer 200 and the variable resistive layer 500. In this case, the first end electrode 150, the switching layer 200, and the intermediate electrode 400 may constitute a two-terminal switching element SD, and the intermediate electrode 400, the variable resistive layer 500, and the second end electrode 350 may constitute a variable resistive element RM. Furthermore, the first end electrode 150 may serve as a word line and an additional word line may be connected to the first end electrode 150. Further, the second end electrode 350 may serve as a bit line and an additional bit line may be connected to the second end electrode 350.

At least after the switching layer 200 is formed, for example, before the intermediate electrode 400 is formed after the switching layer 200 is formed, or before the variable resistive layer 500 is formed after the switching layer 200 and the intermediate electrode 400 are formed thereon, annealing may be performed. The annealing may be heat treatment, UV treatment, or combination treatment in which a plurality thereof are applied. In this case, an on-current density and an on/off ratio of the two-terminal selective element SD may be improved, and a threshold voltage (a turn-on voltage) may be lowered. The heat treatment may be heat treatment using RTA or a furnace. The UV treatment may be annealing using a UV lamp and may be performed using UV-C (UV having a wavelength in a range of 100 nm to 280 nm).

Figure 3:
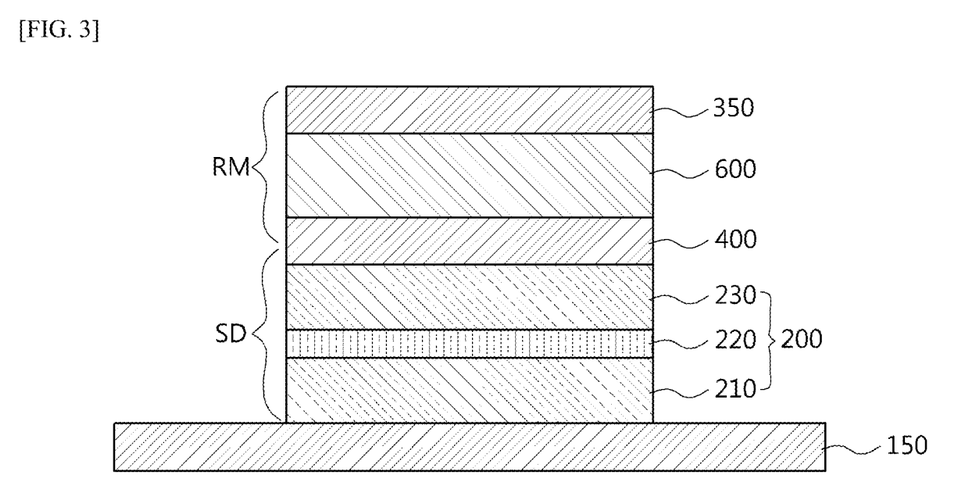
FIG. 3 is a cross-sectional view illustrating a unit cell of a resistive memory cross-point array according to another embodiment of the present invention.

FIG. 3 is a cross-sectional view illustrating a resistive memory cross-point array according to another embodiment of the present invention, and is limited to a unit cell. The resistive memory cross-point array according to the embodiment of the present invention is similar to the cross-point array described with reference to FIG. 2 except for the following description.

Referring to FIG. 3, a variable resistive element RM including a variable resistive layer 600 may be a resistive RAM (RRAM). In this case, the variable resistive layer 600 is a bipolar variable resistive layer, specifically, a RRAM layer having a bipolar characteristic. As an example, the variable resistive layer 600 may be a metal oxide layer (transition metal oxide layer), a chalcogenide layer, a perovskite layer, or a metal-doped solid electrolyte layer. The metal oxide layer may be a $SiO_2$ layer, an $Al_2O_3$ layer, or a transition metal oxide layer. The transition metal oxide layer may be a $HfO_{2-x}$, $MnO_{2-x}$, $ZrO_{2-x}$, $Y_2O_{3-x}$, $TiO_{2-x}$, $NiO_{1-y}$, $Nb_2O_{5-x}$, $Ta_2O_{5-x}$, $CuO_{1-y}$, $Fe_2O_{3-x}$ (e.g., $0 \leq x \leq 1.5$, $0 \leq y \leq 0.5$), or a lanthanoid oxide layer. The lanthanoid may be lanthanum (La), cerium (Ce), praseodymium (Pr), neodymium (Nd), samarium (Sm), gadolinium (Gd), or dysprosium (Dy). The chalcogenide layer may be a GeSbTe layer or a GeTeO (e.g., $Gc_2Te_2O_5$) layer, and the perovskite layer may be a $SrTiO_3$ layer, a Cr layer, a Nb-doped $SrZrO_3$ layer, a PCMO ($Pr_{1-X}Ca_XMnO_3$, 0<X<1) layer, or an LCMO ($La_{1-X}Ca_XMnO_3$, 0<X<1, e.g., X is 0.3) layer. Further, the metal-doped solid electrolyte layer may be a layer in which Ag is doped in GeSe, that is, a AgGeSe layer.

In one embodiment, when a set voltage is applied to the variable resistive element RM, oxygen ions included in the RRAM layer 600 may move to the second end electrode 350 to be stored in the second end electrode 350. In this case, the number of oxygen vacancies is increased in the RRAM layer 600 and the RRAM layer 600 may be changed to have low resistance. Further, when a reset voltage is applied to the variable resistive element RM, the oxygen ions which were moved to the second end electrode 350 may return to the RRAM layer 600. In this case, the number of oxygen vacancies is reduced in the RRAM layer 600 and the RRAM layer 600 may be changed to have high resistance. To this end, the second end electrode 350 may be TiN or WN in which resistance is hardly changed even after the storing of the oxygen. In this case, each of the first end electrode 150 and the intermediate electrode 400 may be an Al, W, Pt, Ti, TaN, WN, or Cu layer.

Figure 4A:
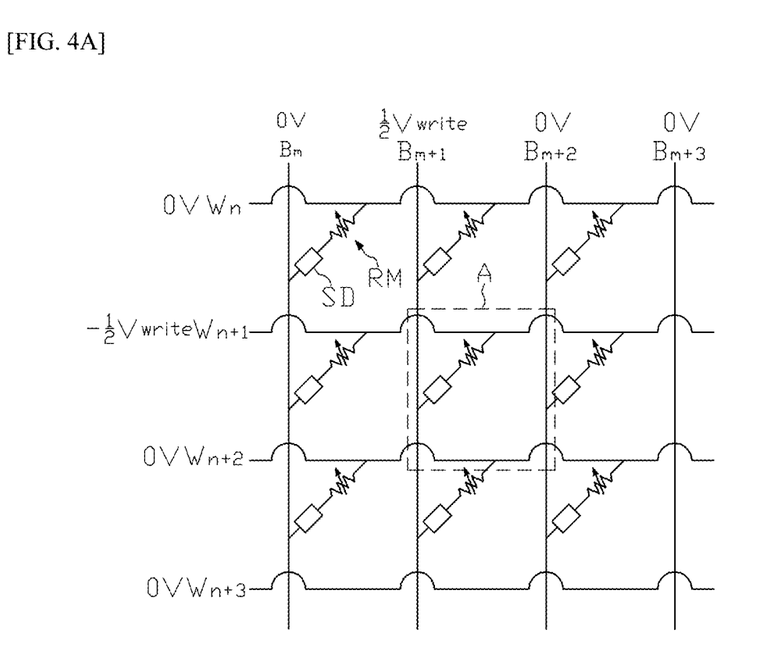
FIGS. 4A and 4B are schematic views for describing a writing method of a resistive memory cross-point array according to an embodiment of the present invention.

FIG. 4A is a schematic view for describing a forward writing method of a resistive memory cross-point array according to an embodiment of the present invention.

Referring to FIG. 4A, a plurality of first data lines, that is, word lines $W_n$, $W_{n+1}$, $W_{n+2}$, and $W_{n+3}$, and a plurality of second data lines, that is, bit lines $B_m$, $B_{m+1}$, $B_{m+2}$, and $B_{m+3}$ crossing the word lines are disposed. A two-terminal switching element SD and a variable resistive element RM, which are connected in series, are disposed at a point at which each word line and each bit line cross. The two-terminal switching element SD is connected to the word line and the variable resistive element RM is connected to the bit line are illustrated, but are not limited thereto and positions of the two-terminal switching element SD and the variable resistive element RM may be changed with each other.

A $\frac{1}{2}V_{write}$ is applied to a bit line $B_{m+1}$ selected from the bit lines and a ground voltage is applied to bit lines $B_m$, $B_{m+2}$, and $B_{m+3}$ not selected from the bit lines. A $-\frac{1}{2}V_{write}$ is applied to a word line $W_{n+1}$ selected from the word lines $W_n$, $W_{n+1}$, $W_{n+2}$, and $W_{n+3}$ and a ground voltage is applied to word lines $W_n$, $W_{n+2}$, $W_{n+3}$ not selected from the word lines. A $V_{write}$ may be applied to a selected unit cell A located at a point at which the selected bit line $B_{m+1}$ and the selected word line $W_{n+1}$ cross, and 0 V, $\frac{1}{2}V_{write}$, or $-\frac{1}{2}V_{write}$ may be applied to the remaining non-selected unit cells.

The $V_{write}$ may have a value of a threshold voltage of the two-terminal switching element SD or more and a value of a set voltage of the variable resistive element RM or more, and the $\frac{1}{2}V_{write}$ may have a value less than the set voltage of the resistive memory element RM. Therefore, in the selected unit cell, only the resistive memory element RM may be selectively changed in a low resistive state (LRS). Meanwhile, in the non-selected unit cell, the state of the resistive memory element RM may not be changed, and the previous state thereof may be maintained.

Figure 4B:
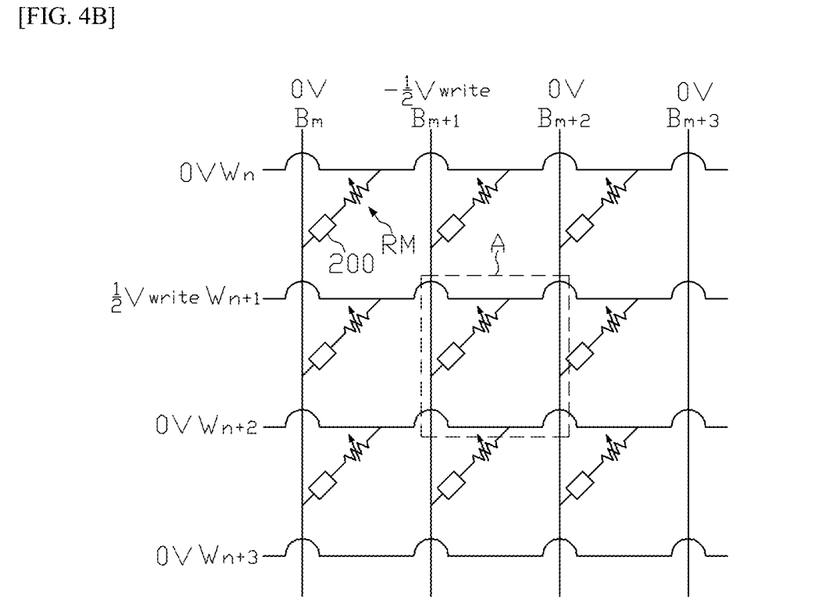

FIG. 4B is a schematic view for describing a backward writing method of a resistive memory cross-point array according to an embodiment of the present invention. The writing method according to the embodiment of the present invention is similar to the forward writing method described with reference to FIG. 4A except for the following description.

Referring to FIG. 4B, a $-\frac{1}{2}V_{write}$ is applied to a bit line $B_{m+1}$ selected from bit lines and a ground voltage is applied to bit lines $B_m$, $B_{m+2}$, and $B_{m+3}$ not selected from the bit lines. A $\frac{1}{2}V_{write}$ is applied to a word line $W_n$, selected from word lines $W_n$, $W_{n+1}$, $W_{n+2}$, and $W_{n+3}$ and a ground voltage is applied to word lines $W_n$, $W_{n+2}$, $W_{n+3}$ not selected from the word lines. A $-V_{write}$ may be applied to a selected unit cell A located at a point at which the selected bit line $B_{m+1}$ and the selected word line $W_{n+1}$ cross, and 0 V, $\frac{1}{2}V_{write}$, or $-\frac{1}{2}V_{write}$ may be applied to the remaining non-selected unit cells.

The $-V_{write}$ may have a value of a backward threshold voltage of the two-terminal switching element SD or less and a reset voltage or less of the resistive memory element RM. Therefore, in the selected unit cell, only the resistive memory element RM may be selectively changed in a high resistive state (HRS). Meanwhile, in the non-selected unit cell, the state of the resistive memory element RM may not be changed, and a previous state thereof may be maintained.

Hereinafter, exemplary experimental examples will be introduced to help with understanding of the present invention. However, the experimental examples below are intended only to help with understanding of the present invention, and the present invention is not limited thereto.

Experimental Examples; Examples

Manufacturing Example 1: Manufacturing of P-N-P Switching Element, IGZO_5 nm

A 30 nm Ti layer was formed on a $SiO_2$ layer of a Si substrate including a 200 nm layer of the $SiO_2$ using a magnetron sputtering method with a Ti target in a pure argon atmosphere, and then 100 nm of a Pt layer was formed using a magnetron sputtering method with a Pt target in the same atmosphere. Then, a P-type metal oxide semiconductor layer, which was a 30 nm $CoO_x$ layer, was formed on the Pt layer using a magnetron sputtering method with a CoO target in an atmosphere in which 1.1 sccm of oxygen and 10 sccm of argon were mixed. An N-type metal oxide semiconductor layer, which was a 5 nm IGZO layer, was formed on the $CoO_x$ layer using a magnetron sputtering method with an IGZO (InGaZnO) target in a pure argon atmosphere. A P-type metal oxide semiconductor layer, which was a 30 nm $CoO_x$ layer, was formed on the IGZO layer using a magnetron sputtering method with a CoO target in an atmosphere in which 1.1 sccm of oxygen and 10 sccm of argon were mixed. Then, a 100 nm Pt pattern was formed on the $CoO_x$ layer using a magnetron sputtering method with a Pt target and using a metal shadow mask in a pure argon atmosphere. Then, UV treatment in which ultraviolet in a UV-C (UV having a wavelength in a range of 100 nm to 280 nm) region was emitted for 20 minutes or more was performed in a high vacuum state of $10^{-6}$ Torr or less.

Manufacturing Example 2: Manufacturing of P-N-P Switching Element, IGZO 10 nm

A switching element was manufactured using the same method as Manufacturing Example 1 of the switching element except that a 10 nm IGZO layer was formed.

Manufacturing Example 3: Manufacturing of P-N-P Switching Element, IGZO 20 nm

A switching element was manufactured using the same method as Manufacturing Example 1 of the switching element except that a 20 nm IGZO layer was formed.

Manufacturing Example 4: Manufacturing of P-N-P Switching Element, IGZO 50 nm

A switching element was manufactured using the same method as Manufacturing Example 1 of the switching element except that a 50 nm IGZO layer was formed.

Manufacturing Example 5: Manufacturing of P-N-P Switching Element, Except UV Treatment A switching element was manufactured using the same method as Manufacturing Example 1 except that UV treatment was not performed.

Figure 5:
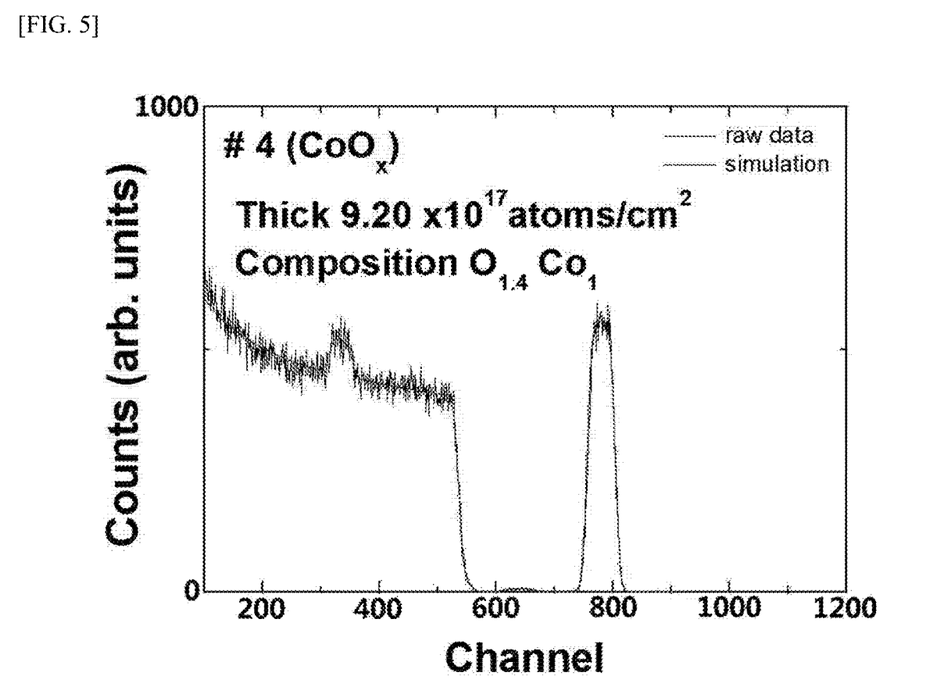
FIG. 5 is a graph illustrating a Rutherford backscattering spectroscopy (RBS) peak of a $CoO_x$ layer obtained through manufacturing of Manufacturing Example 1.

FIG. 5 is a graph illustrating a Rutherford backscattering spectroscopy (RBS) peak with respect to the $CoO_x$ layer obtained through the manufacturing of Manufacturing Example 1.

Referring to FIG. 5, it was analyzed that an atomic ratio of Co and O of the CoO layer was 1:1.4, that is, x was 1.4. This shows that an atomic ratio of O increased more than a case in which a stoichiometric ratio is satisfied ($CoO_x$, where x=1) and a content of metal vacancies in the $CoO_x$ (x=1.4) layer increased.

Figure 6A:
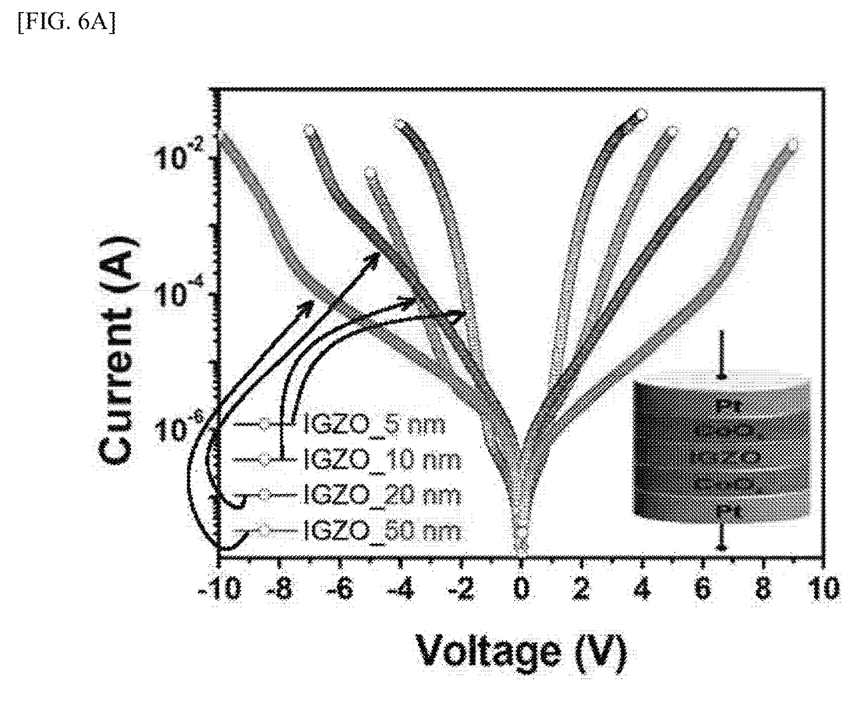
FIGS. 6A and 6B are graphs illustrating current-voltage characteristics of P-N-P switching elements manufactured through Manufacturing Examples 1 to 4.
Figure 6B:
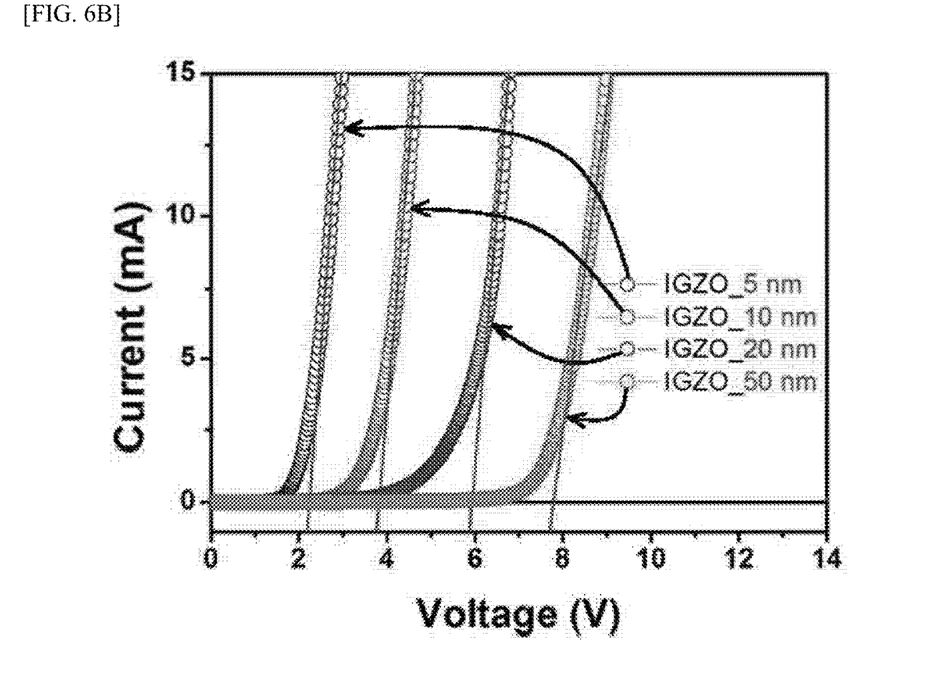

FIGS. 6A and 6B are graphs illustrating current-voltage characteristics of the P-N-P switching elements manufactured through Manufacturing Examples 1 to 4.

Referring to FIGS. 6A and 6B, it may be seen that a turn-on voltage is reduced, and further, an on-current is increased as a thickness of an IGZO layer is reduced. As an example, it was shown that the turn-on voltage of the P-N-P the switching element was about 2 V and the on-current (@4 V) was a very good value such as about $10^{-2}$ when the IGZO layer was 5 nm. It may be seen that the increasing of the on-current is a result of the increase in current density of the $CoO_x$ layer which is a P-type metal oxide semiconductor layer. The increase in the current density of the $CoO_x$ layer is considered to have resulted from the increase in content of metal vacancies according to the increase of the x value.

Figure 7:
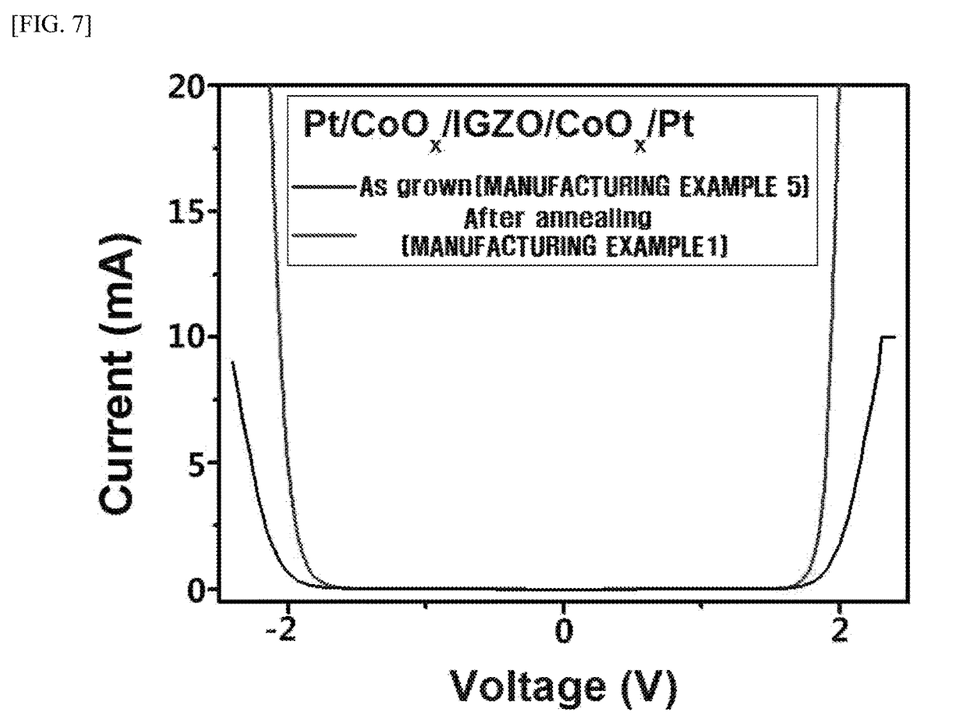
FIG. 7 is a graph illustrating current-voltage characteristics of P-N-P switching elements manufactured through Manufacturing Examples 1 and 5.

FIG. 7 is a graph illustrating current-voltage characteristics of the P-N-P switching elements manufactured through Manufacturing Example 1 and Manufacturing Example 5.

Referring to FIG. 7, it may be seen that a turn-on voltage is slightly reduced in the case in which UV treatment was performed (Manufacturing Example 1) compared to the case in which the UV treatment was not performed (Manufacturing Example 7), and further, an on-current is improved. Thus, it may be estimated that the UV treatment improves an interface characteristic between metal oxide semiconductor layers and/or between a metal oxide semiconductor layer and a metal layer.

Manufacturing Example 6: Manufacturing of Variable Resistive Element

A 30 nm Ti layer was formed on a $SiO_2$ layer of a Si substrate including a 200 nm layer of the $SiO_2$ using a magnetron sputtering method with a Ti target in a pure argon atmosphere and then a 100 nm Pt layer was formed using a magnetron sputtering method with a Pt target in the same atmosphere. Then, the RRAM layer, which was a 30 nm $TiO_x$ layer (x=1.75), was formed on the Pt layer using a magnetron sputtering method with a $TiO_2$ target in an atmosphere in which 10 sccm of oxygen and 6 sccm of argon were mixed. A 100 nm TiN pattern was formed on the $TiO_x$ layer using a magnetron sputtering method with a Ti target and using a metal shadow mask in an atmosphere in which 1.5 sccm of nitrogen and 8 sccm of argon were mixed.

Figure 8:
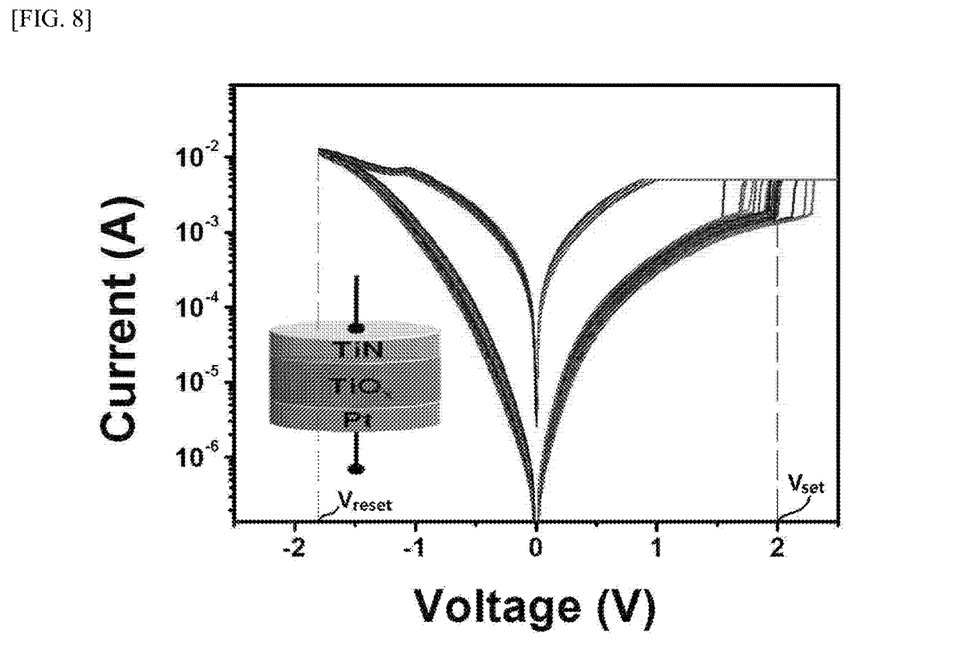
FIG. 8 is a graph illustrating a current-voltage characteristic of a variable resistive element manufactured through Manufacturing Example 6.

FIG. 8 is a graph illustrating a current-voltage characteristic of the variable resistive element manufactured through Manufacturing Example 6.

Referring to FIG. 8, it may be seen that the variable resistive element manufactured through Manufacturing Example 6 shows a bipolar characteristic having a set voltage of about 2 V and a reset voltage of about −2 V.

Figure 9A:
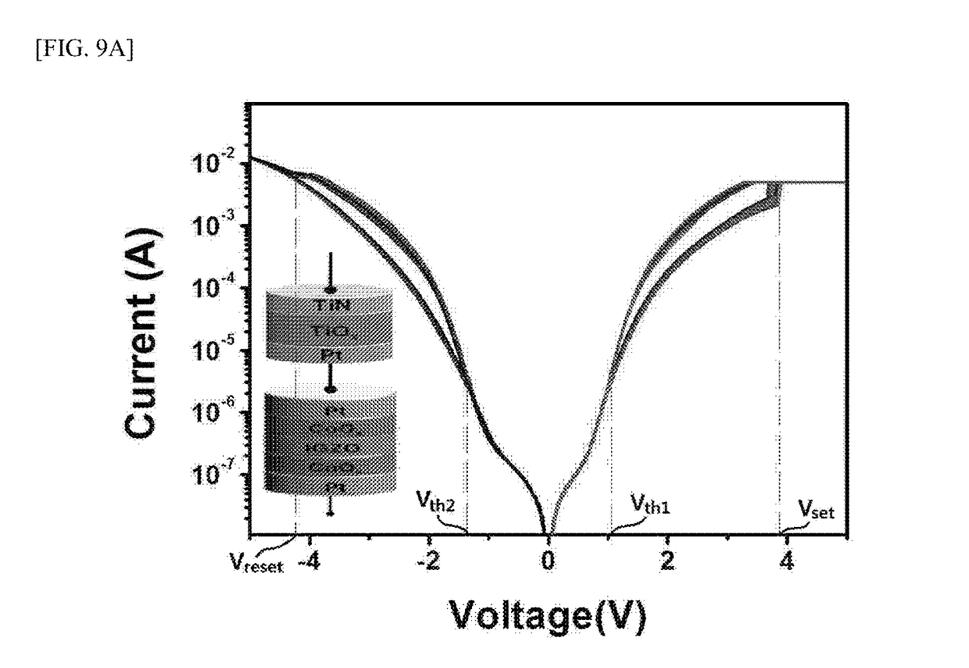
FIGS. 9A and 9B are graphs illustrating a current-voltage characteristic of an element including a P-N-P switching element and a variable resistive element, which are connected in series.
Figure 9B:
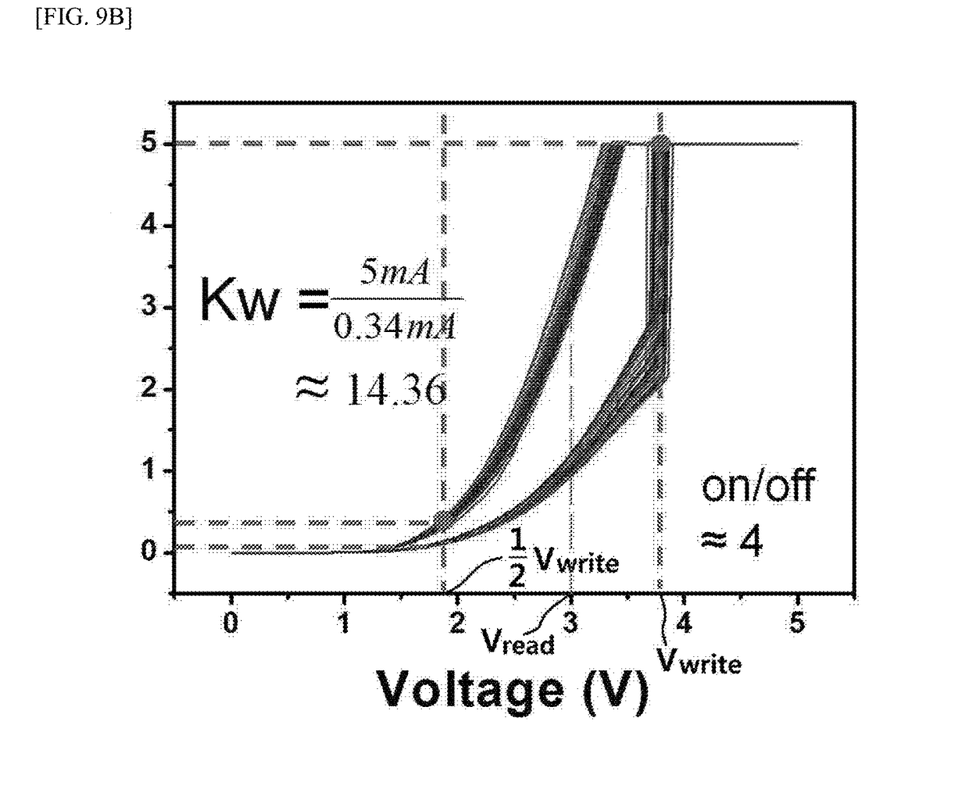

FIGS. 9A and 9B are graphs illustrating a current-voltage characteristic of an element including a P-N-P switching element and a variable resistive element, which are connected in series. Specifically, Pt which is an upper electrode of the P-N-P switching element manufactured through Manufacturing Example 1 and Pt which is a lower electrode of the variable resistive element manufactured through Manufacturing Example 6 are connected through a wire bonding.

Referring to FIGS. 9A and 9B, it may be seen that a forward threshold voltage $V_{th1}$ of the switching element is about 1 V, and a backward threshold voltage $V_{th2}$ is about −1 V. Further, it may be seen that a set voltage of the variable resistive element is about 4 V and a reset voltage thereof is about −4 V. Accordingly, the $V_{write}$ described with reference to FIGS. 4A and 4B may be set to about 4 V which is the set voltage, and the $-V_{write}$ may be set to about −4 V which is the reset voltage. Further, when a voltage $V_{read}$ applied to the selected unit cell is set to about 3 V in order to read data of the selected unit cell, a ratio of an on-current with respect to an off-current may be about 4.

Although the invention has been described in detail with reference to exemplary embodiments, the invention is not limited thereto. Those skilled in the art may make various modifications and changes without departing from the spirit and scope of the present invention.

The invention claimed is:

1. A resistive memory cross-point array comprising:
a plurality of first data lines;
a plurality of second data lines crossing the first data lines;
a switching layer disposed between each of the first data lines and each of the second data lines at a point at which each of the first data lines and each of the second data lines cross and including a pair of P-type metal oxide semiconductor layers and an N-type metal oxide semiconductor layer disposed between the pair of P-type metal oxide semiconductor layers, wherein the N-type metal oxide semiconductor layer has a smaller thickness than each of the P-type metal oxide semiconductor layers; and
a bipolar variable resistive memory layer disposed between the switching layer and the second data line, wherein the P-type metal oxide semiconductor layers are $CoO_x$ ($1.3<x<1.5$) layers, and the N-type metal oxide semiconductor layer is InGaZnO and wherein the thickness of the N-type metal oxide semiconductor is 1 nm to 5 nm and the thickness of each of the P-type metal oxide semiconductor layers is 10 nm to 30 nm.

2. The array of claim 1, wherein the bipolar variable resistive memory layer is a magnetic tunnel junction (MTJ) structure or a resistance change memory layer.

3. The array of claim 1, further comprising an intermediate electrode located between the switching layer and the bipolar variable resistive memory layer.

4. The array of claim 1, wherein the P-type metal oxide semiconductor layer is $CoO_x$ ($x=1.4$).

5. The array of claim 1, wherein the P-type metal oxide semiconductor layer has a band gap of 1 to 2 eV.

* * * * *